United States Patent
Shum et al.

(10) Patent No.: US 8,803,452 B2
(45) Date of Patent: Aug. 12, 2014

(54) HIGH INTENSITY LIGHT SOURCE

(75) Inventors: Frank Tin Chung Shum, Sunnyvale, CA (US); Clifford Jue, Santa Cruz, CA (US)

(73) Assignee: Soraa, Inc., Fremont, CA (US)

( * ) Notice: Subject to any disclaimer, the term of this patent is extended or adjusted under 35 U.S.C. 154(b) by 300 days.

(21) Appl. No.: 13/269,193

(22) Filed: Oct. 7, 2011

(65) Prior Publication Data

US 2012/0187830 A1 Jul. 26, 2012

Related U.S. Application Data

(60) Provisional application No. 61/391,560, filed on Oct. 8, 2010.

(51) Int. Cl.
*H05K 3/30* (2006.01)
*F21V 17/00* (2006.01)

(52) U.S. Cl.
USPC ............ 315/320; 315/291; 362/249.01

(58) Field of Classification Search
USPC ............ 315/291, 307, 308, 224, 320; 362/249.01–249.08
See application file for complete search history.

(56) References Cited

U.S. PATENT DOCUMENTS

| | | | |
|---|---|---|---|
| 5,764,674 A | 6/1998 | Hibbs-Brenner et al. | |
| 6,204,602 B1 | 3/2001 | Yang et al. | |
| 6,501,154 B2 | 12/2002 | Morita et al. | |
| D471,881 S | 3/2003 | Hegde | |
| 6,787,999 B2 | 9/2004 | Stimac et al. | |
| 6,853,010 B2 | 2/2005 | Slater et al. | |
| 6,964,877 B2* | 11/2005 | Chen et al. ........... | 438/20 |
| 7,053,413 B2 | 5/2006 | D'Evelyn et al. | |
| 7,148,515 B1 | 12/2006 | Huang et al. | |
| 7,220,324 B2 | 5/2007 | Baker et al. | |
| D545,457 S | 6/2007 | Chen | |
| 7,252,408 B2 | 8/2007 | Mazzochette | |
| 7,253,446 B2 | 8/2007 | Sakuma et al. | |

(Continued)

FOREIGN PATENT DOCUMENTS

| | | |
|---|---|---|
| JP | 2000-517465 | 12/2000 |
| JP | 2011-501351 | 1/2011 |
| WO | WO 2011/054716 | 5/2011 |

OTHER PUBLICATIONS

U.S. Appl. No. 13/135,087, filed Jun. 23, 2011, Trottier et al., unpublished.

(Continued)

*Primary Examiner* — Jimmy Vu
*Assistant Examiner* — Amy Yang
(74) *Attorney, Agent, or Firm* — Kilpatrick Townsend & Stockton LLP

(57) ABSTRACT

A light source comprises a heat-sink having a mounting region, and heat-dissipating fins, a base housing having an inner cavity and coupled to the heat-sink, and an integrated lighting module including: a printed circuit board; an LED on a substrate coupled to the printed circuit board within a first lateral region of the printed circuit board, and an electronic driving circuit for providing power to the LED and coupled to the printed circuit board within a second lateral region of the printed circuit board, wherein a bottom surface of the substrate is thermally coupled to the mounting region of the heat-sink, and wherein the second lateral region of the integrated lighting module is located within the inner cavity of the base housing.

22 Claims, 6 Drawing Sheets

(56) References Cited

U.S. PATENT DOCUMENTS

| | | | |
|---|---|---|---|
| 7,311,417 B1 | 12/2007 | Lemke | |
| 7,338,828 B2 | 3/2008 | Imer et al. | |
| 7,344,279 B2 * | 3/2008 | Mueller et al. | 362/294 |
| D581,583 S | 11/2008 | Peng | |
| D592,613 S | 5/2009 | Plonski et al. | |
| 7,550,305 B2 | 6/2009 | Yamagata et al. | |
| 7,637,635 B2 | 12/2009 | Xiao et al. | |
| 7,658,528 B2 | 2/2010 | Hoelen et al. | |
| 7,663,229 B2 | 2/2010 | Lu et al. | |
| 7,674,015 B2 | 3/2010 | Chien | |
| D618,634 S | 6/2010 | Lin et al. | |
| 7,744,259 B2 | 6/2010 | Walczak et al. | |
| D619,551 S | 7/2010 | Lin et al. | |
| 7,748,870 B2 | 7/2010 | Chang et al. | |
| 7,824,075 B2 | 11/2010 | Maxik | |
| 7,889,421 B2 | 2/2011 | Narendran et al. | |
| 7,972,040 B2 * | 7/2011 | Li et al. | 362/311.02 |
| 7,993,031 B2 | 8/2011 | Grajcar | |
| D652,564 S | 1/2012 | Maxik | |
| 8,153,475 B1 | 4/2012 | Shum et al. | |
| D662,899 S | 7/2012 | Shum et al. | |
| D662,900 S | 7/2012 | Shum et al. | |
| 8,227,962 B1 | 7/2012 | Su | |
| 8,272,762 B2 | 9/2012 | Maxik et al. | |
| 8,324,835 B2 | 12/2012 | Shum et al. | |
| D674,960 S | 1/2013 | Chen et al. | |
| 8,405,947 B1 | 3/2013 | Green et al. | |
| 8,414,151 B2 | 4/2013 | Allen et al. | |
| 8,525,396 B2 | 9/2013 | Shum et al. | |
| D694,722 S | 12/2013 | Shum et al. | |
| 2003/0039122 A1 | 2/2003 | Cao | |
| 2003/0058650 A1 | 3/2003 | Shih | |
| 2004/0264195 A1 | 12/2004 | Chang et al. | |
| 2005/0174780 A1 | 8/2005 | Park | |
| 2005/0214992 A1 | 9/2005 | Chakraborty et al. | |
| 2006/0065900 A1 | 3/2006 | Hsieh et al. | |
| 2006/0152795 A1 | 7/2006 | Yang | |
| 2006/0208262 A1 | 9/2006 | Sakuma et al. | |
| 2006/0240585 A1 | 10/2006 | Epler et al. | |
| 2006/0262545 A1 | 11/2006 | Piepgras et al. | |
| 2006/0274529 A1 | 12/2006 | Cao | |
| 2007/0007898 A1 | 1/2007 | Bruning | |
| 2007/0284564 A1 | 12/2007 | Biwa et al. | |
| 2008/0049399 A1 | 2/2008 | Lu et al. | |
| 2008/0080137 A1 | 4/2008 | Otsuki et al. | |
| 2008/0123341 A1 | 5/2008 | Chiu | |
| 2008/0142781 A1 | 6/2008 | Lee | |
| 2008/0158887 A1 | 7/2008 | Zhu et al. | |
| 2008/0164489 A1 | 7/2008 | Schmidt et al. | |
| 2008/0266866 A1 | 10/2008 | Tsai | |
| 2008/0315228 A1 | 12/2008 | Krames et al. | |
| 2009/0072252 A1 | 3/2009 | Son et al. | |
| 2009/0134421 A1 | 5/2009 | Negley | |
| 2009/0154166 A1 * | 6/2009 | Zhang et al. | 362/294 |
| 2009/0161356 A1 | 6/2009 | Negley et al. | |
| 2009/0173958 A1 | 7/2009 | Chakraborty | |
| 2009/0175043 A1 | 7/2009 | Frick | |
| 2009/0195186 A1 | 8/2009 | Guest et al. | |
| 2009/0244899 A1 | 10/2009 | Chyn | |
| 2009/0315965 A1 | 12/2009 | Yamagata et al. | |
| 2010/0003492 A1 | 1/2010 | D'Evelyn | |
| 2010/0025656 A1 | 2/2010 | Raring et al. | |
| 2010/0060130 A1 | 3/2010 | Li et al. | |
| 2010/0061076 A1 | 3/2010 | Mandy et al. | |
| 2010/0091487 A1 | 4/2010 | Shin | |
| 2010/0148145 A1 | 6/2010 | Ishibashi et al. | |
| 2010/0207502 A1 | 8/2010 | Cao et al. | |
| 2010/0207534 A1 * | 8/2010 | Dowling et al. | 315/186 |
| 2010/0244648 A1 | 9/2010 | Yoo | |
| 2010/0264799 A1 | 10/2010 | Liu et al. | |
| 2010/0277068 A1 | 11/2010 | Broitzman | |
| 2010/0290229 A1 | 11/2010 | Meyer, Sr. et al. | |
| 2010/0320499 A1 | 12/2010 | Catalano et al. | |
| 2011/0032708 A1 | 2/2011 | Johnston et al. | |
| 2011/0056429 A1 | 3/2011 | Raring et al. | |
| 2011/0095686 A1 | 4/2011 | Falicoff et al. | |
| 2011/0140150 A1 | 6/2011 | Shum | |
| 2011/0140586 A1 | 6/2011 | Wang | |
| 2011/0169406 A1 | 7/2011 | Weekamp et al. | |
| 2011/0175510 A1 | 7/2011 | Rains, Jr. et al. | |
| 2011/0182056 A1 | 7/2011 | Trottier et al. | |
| 2011/0182065 A1 | 7/2011 | Negley et al. | |
| 2011/0186874 A1 | 8/2011 | Shum | |
| 2011/0186887 A1 | 8/2011 | Trottier et al. | |
| 2011/0198979 A1 | 8/2011 | Shum et al. | |
| 2011/0204763 A1 | 8/2011 | Shum et al. | |
| 2011/0204779 A1 | 8/2011 | Shum et al. | |
| 2011/0204780 A1 | 8/2011 | Shum et al. | |
| 2011/0215348 A1 | 9/2011 | Trottier et al. | |
| 2011/0242823 A1 | 10/2011 | Tracy et al. | |
| 2011/0309734 A1 | 12/2011 | Lin et al. | |
| 2012/0161626 A1 | 6/2012 | van de Ven et al. | |
| 2012/0293062 A1 | 11/2012 | Pickard | |
| 2013/0058099 A1 | 3/2013 | Shum et al. | |
| 2013/0322089 A1 | 12/2013 | Martis et al. | |

OTHER PUBLICATIONS

U.S. Appl. No. 12/914,789, filed Oct. 28, 2010, Shum, unpublished.
U.S. Appl. No. 12/858,379, filed Aug. 17, 2010, Shum, unpublished.
U.S. Appl. No. 61/257,303, filed Nov. 2, 2009, Shum, unpublished.
U.S. Appl. No. 61/256,934, filed Oct. 30, 2009, Shum, unpublished.
U.S. Appl. No. 61/241,457, filed Sep. 11, 2009, Shum, unpublished.
U.S. Appl. No. 61/241,455, filed Sep. 11, 2009, Shum, unpublished.
USPTO Notice of Allowance for U.S. Appl. No. 29/399,523 dated Mar. 5, 2012.
USPTO Notice of Allowance for U.S. Appl. No. 29/399,524 dated Mar. 2, 2012.
USPTO Office Action for U.S. Appl. No. 13/025,791 dated Feb. 20, 2013.
USPTO Office Action for U.S. Appl. No. 13/025,849 dated Mar. 15, 2013.
International Preliminary Report & Written Opinion of PCT Application No. PCT/US2011/060030 dated Mar. 21, 2012, 11 pgs. total.
'CFL Ballast IC Drive LED', www.placardshop.com, Blog, May 22, 2012, 3 pgs.
Rausch, 'Use a CFL ballast to drive LEDs', EDN Network, 2007, pp. 1-2.
USPTO Office Action for U.S. Appl. No. 12/785,953 dated Jan. 11, 2013.
USPTO Notice of Allowance for U.S. Appl. No. 13/025,791 dated Jun. 17, 2013.
USPTO Office Action for U.S. Appl. No. 13/025,833 dated Apr. 26, 2013.
Haskell et al., 'Defect Reduction in (1100) m-plane gallium nitride via lateral epitaxial overgrowth by hydride vapor phase epitaxy', Applied Physics Letters 86, 111917 (2005), pp. 1-3.
USPTO Office Action for U.S. Appl. No. 12/785,953 dated Apr. 12, 2012.
USPTO Office Action for U.S. Appl. No. 13/025,791 dated Nov. 25, 2011.
USPTO Office Action for U.S. Appl. No. 13/025,833 dated Dec. 14, 2011.
USPTO Office Action for U.S. Appl. No. 13/025,860 dated Dec. 30, 2011.
USPTO Notice of Allowance for U.S. Appl. No. 13/025,860 dated Jun. 8, 2012.
USPTO Office Action for U.S. Appl. No. 13/025,833 dated Jul. 12, 2012.
Nakamura, 'Candela-Class High-Brightness InGaN/AlGaN Double-Heterostructure Blue-LightEmitting Diodes', Applied Physics Letters, vol. 64, No. 13, Mar. 1994, pp. 1687-1689.
Communication from the Japanese Patent Office re 2012191931, dated Oct. 11, 2013, 4 pages.
USPTO Notice of Allowance for U.S. Appl. No. 13/025,833 dated Oct. 11, 2013 (11 pages).
USPTO Office Action for U.S. Appl. No. 13/480,767 dated Oct. 25, 2013 (28 pages).
USPTO Office Action for U.S. Appl. No. 13/535,142 dated Nov. 14, 2013 (23 pages).

(56) References Cited

OTHER PUBLICATIONS

USPTO Office Action for U.S. Appl. No. 13/959,422 dated Oct. 8, 2013 (10 pages).
USPTO Notice of Allowance for U.S. Appl. No. 13/025,849 dated Sep. 16, 2013, 10 pages.
USPTO Office Action for U.S. Appl. No. 13/274,489 dated Sep. 6, 2013, 13 pages.
USPTO Office Action for U.S. Appl. No. 13/535,142 dated Aug. 1, 2013, 14 pages.
USPTO Notice of Allowance for U.S. Appl. No. 29/423,725 dated Jul. 19, 2013, 11 pages.

\* cited by examiner

HIGH INTENSITY LIGHT SOURCE

CROSS-REFERENCE TO RELATED APPLICATIONS

The present application relates to and claims priority to U.S. Provisional Patent Application No. 61/391,506, filed Oct. 8, 2010. This provisional patent application is incorporated herein by reference for all purposes.

BACKGROUND

The present invention relates to lighting. More specifically, the present invention relates to high efficiency lighting sources.

The era of the Edison vacuum light bulb will be coming to an end soon. In many countries and in many states, common incandescent bulbs are becoming illegal, and more efficient lighting sources are being mandated. Some of the alternative light sources currently include fluorescent tubes, halogen, and light emitting diodes (LEDs). Despite the availability and improved efficiencies of these other options, many people have still been reluctant to switch to these alternative light sources.

The inventors of the present believe that there are several key reasons why consumers have been slow to adopt the newer technologies. One such reason is the use of toxic substances in the lighting sources. As an example, fluorescent lighting sources typically rely upon mercury in a vapor form to produce light. Because the mercury vapor is considered a hazardous material, spent lamps cannot simply be disposed of at the curbside but must be transported to designated hazardous waste disposal sites. Additionally, some fluorescent tube manufacturers go so far as to instruct the consumer to avoid using the bulb in more sensitive areas of the house such as bedrooms, kitchens, and the like.

The inventors of the present invention also believe that another reason for the slow adoption of alternative lighting sources is the low performance compared to the incandescent light bulb. As an example, fluorescent lighting sources often rely upon a separate starter or ballast mechanism to initiate the illumination. Because of this, fluorescent lights sometimes do not turn on "instantaneously" as consumers expect and demand. Further, fluorescent lights typically do not immediately provide light at full brightness, but typically ramp up to full brightness within an amount of time (e.g. 30 seconds). Further, most fluorescent lights are fragile, are not capable of dimming, have ballast transformers that can emit annoying audible noise, and can fail in a shortened period of time if cycled on and off frequently. Because of this, fluorescent lights do not have the performance consumers require.

Another type of alternative lighting source more recently introduced relies on the use of light emitting diodes (LEDs). LEDs have advantages over fluorescent lights including the robustness and reliability inherent in solid state devices, the absence of toxic chemicals that can be released during accidental breakage or disposal, instant-on capabilities, dimmability, and the absence of audible noise. The inventors of the present invention believe, however, that current LED lighting sources themselves have significant drawbacks that cause consumers to be reluctant to using them.

A key drawback with current LED lighting sources is that the light output (e.g. lumens) is relatively low. Although current LED lighting sources draw a significantly lower amount of power than their incandescent equivalents (e.g. 5-10 watts v. 50 watts), they are believed to be far too dim to be used as primary lighting sources. As an example, a typical 5 watt LED lamp in the MR-16 form factor may provide 200-300 lumens, whereas a typical 50 watt incandescent bulb in the same form factor may provide 700-1000 lumens. As a result, current LEDs are often used only for exterior accent lighting, closets, basements, sheds or other small spaces.

Another drawback with current LED lighting sources includes that the upfront cost of the LED is often shockingly high to consumers. For example, for floodlights, a current 30 watt equivalent LED bulb may retail for over $60, whereas a typical incandescent floodlight may retail for $12. Although the consumer may rationally "make up the difference" over the lifetime of the LED by the LED consuming less power, the inventors believe the significantly higher prices greatly suppress consumer demand. Because of this, current LED lighting sources do not have the price or performance that consumers expect and demand.

Additional drawbacks with current LED lighting sources includes they have many parts and are labor intensive to produce. As merely an example, one manufacturer of an MR-16 LED lighting source utilizes over 14 components (excluding electronic chips), and another manufacturer of an MR-16 LED lighting source utilizes over 60 components. The inventors of the present invention believe that these manufacturing and testing processes are more complicated and more time consuming, compared to manufacturing and testing of a LED device with fewer parts and a more modular manufacturing process.

Additional drawbacks with current LED lighting sources, are that the output performance is limited by heat-sink volume. More specifically, the inventors believe for replacement LED light sources, such as MR-16 light sources, current heat-sinks are incapable of dissipating very much heat generated by the LEDs under natural convection. In many applications, the LED lamps are placed into an enclosure such as a recessed ceiling that already have an ambient air temperatures to over 50 degrees C. At such temperatures the emissivity of surfaces play only a small roll of dissipating the heat. Further, because conventional electronic assembly techniques and LED reliability factors limit PCB board temperatures to about 85 degrees C., the power output of the LEDs is also greatly constrained. At higher temperatures, the inventors have discovered that radiation plays much more important role thus high emissivity for a heat-sink is desirable.

Traditionally, light output from LED lighting sources have been increased by simply increasing the number of LEDs, which has lead to increased device costs, and increased device size. Additionally, such lights have had limited beam angles and limited outputs.

Accordingly, what is desired is a highly efficient lighting source without the drawbacks described above.

BRIEF SUMMARY

The present invention relates to high efficient lighting sources. More specifically, the present invention relates to a novel LED lighting source and methods of manufacturing thereof. Some general goals include, to increase light output without increasing device cost or device size, to enable coverage of many beam angles, and to provide a high reliability product for long life (ROI).

Various embodiments of the present invention include a novel modular lighting source. More specifically, various embodiments include an MR-16 form factor light source. A lighting module includes from 20 to 110 LEDs arrayed in series upon a top surface of thermally conductive substrate (e.g. silicon substrate). The top surface of the silicon substrate is soldered onto a first portion of a flexible printed circuit substrate (FPC). The bottom surface of the conductive silicon substrate is physically bonded to a recess of an MR-16 form factor heat-sink via a thermal epoxy. In various embodiments, electrical driving components are soldered onto a second portion of the FPC, and the second portion of the FPC is inserted into an interior cavity of a thermally conductive plug base. A potting compound is then injected into the cavity of the plug base and to the recess of the heat-sink in one step. The potting compound allows heat generated by the silicon substrate and the electrical driving components to be transferred to the heat-sink or thermally conductive plug base. A lens is then secured to the heat-sink.

In one embodiment, the electrical driving portion/module transforms the input power from 12 AC volts to a higher DC voltage, such as 40 volts 120 Volts. In turn, the driving portion drives the lighting module with the higher voltage, and the lighting module emits the light. The light is conditioned with the lens to the desired type of lighting, e.g. spot, flood, etc. In operation, the driving module and the lighting module produce heat that is dissipated by the MR-16 form factor heat-sink. At steady state, these modules may operate in the range of approximately 75° C. to 130° C.

In various embodiments of the present invention the MR-16 form factor heat-sink greatly facilitates the dissipation of heat. The heat-sink includes an inner core that has a diameter less than half the outer diameter of the heat-sink. In various embodiments, the inner core is less than one third, one fourth, and one fifth the outer diameter. The silicon substrate of the LEDs is directly bonded to the inner core region via the thermal epoxy.

In various embodiments, because the diameter of the inner core is much less than the outer diameter, a larger amount of heat dissipating fins can be provided. A number of heat dissipating fin configurations have been developed and studied by the inventors. Typical fin configurations include a number radiating fin "trunks" extending from the inner core. In some embodiments, the number of trunks range from 8 to 35. At the end of each trunk, two or more fin "branches" are provided having "U" branching shape. In various embodiments, at the end of each branch, two or more fin "sub-branches" are provided, also having a "U" branching shape. In various embodiments, the fin thickness of the trunk may be thicker than the branches, which in turn may be thicker than the sub-branches, etc. The amount of heat flow from the inner core towards the outer diameter, airflow, and surface area are therefore carefully engineered to greatly increase heat dissipating capability.

Other aspects of various embodiments include: simplified construction facilitating high volume manufacturing, flex interconnects to eliminate hand wiring, modular subassembly construction to enable parallel processing. Other features include thermal management aspects: Fin branching algorithm, reduced cross section central core, airflow behind lens, single thermal interface, direct die attachment, flex printed circuits, base contour to minimize potting material, recessed front, ensured airflow with coverage; Low-Cost Manufacturing: flexible printed circuit interconnect (Main and interposer), flex circuit light chip interposer, redundant latching and bonding features, and the like. Other aspects include: high temperature operation enabling a densely packed LED array, higher component reliability, high heat dissipation, maximum surface area, maximum airflow, minimum thermal interface losses, minimum length thermal paths within the electronics module, and the like. Advantages with embodiments of the present invention include operating a LED light source reliably at high temperatures, allowing the concentration of a large number of LEDs in a small space while simultaneously operating them at higher power levels.

According to one aspect of the invention, a light source is described. One apparatus includes a heat-sink comprising a mounting region, and a plurality of heat-dissipating fins, and a base housing coupled to the heat-sink, wherein the base housing includes an inner cavity. A device may include an integrated lighting module coupled to the heat-sink and to the base housing. The integrated lighting module may include a printed circuit board, a light emitting source formed on a top surface of substrate, wherein the top surface of the substrate is coupled to a first surface of the printed circuit board within a first lateral region of the printed circuit board, and an electronic driving circuit configured to provide electrical power to the light emitting source, wherein the electronic driving circuit is coupled to the first surface of the printed circuit board within a second lateral region of the printed circuit board. In various apparatus a bottom surface of the substrate is thermally coupled to the mounting region of the heat-sink, and wherein the second lateral region of the integrated lighting module is located within the inner cavity of the base housing.

According to yet another aspect of the invention, a method for assembling a light source is described. One technique includes receiving a heat-sink comprising a mounting region, and a plurality of heat-dissipating structures, and receiving a base housing coupled to the heat-sink, wherein the base housing includes an inner cavity. A process may include receiving an integrated lighting module, wherein the integrated lighting module includes a printed circuit board having a first lateral region and a second lateral region, wherein a first surface of the printed circuit board within the first lateral region is coupled to a top surface of a light emitting source substrate, and wherein the first surface of the printed circuit board within the second lateral region is coupled to a plurality of electronic driving devices. A methodology may include disposing the second lateral region of the integrated lighting module within the inner cavity of the base housing, and coupling a bottom surface of the light emitting source substrate to the mounting region of the heat-sink.

BRIEF DESCRIPTION OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which.

DETAILED DESCRIPTION

Figure 1A:
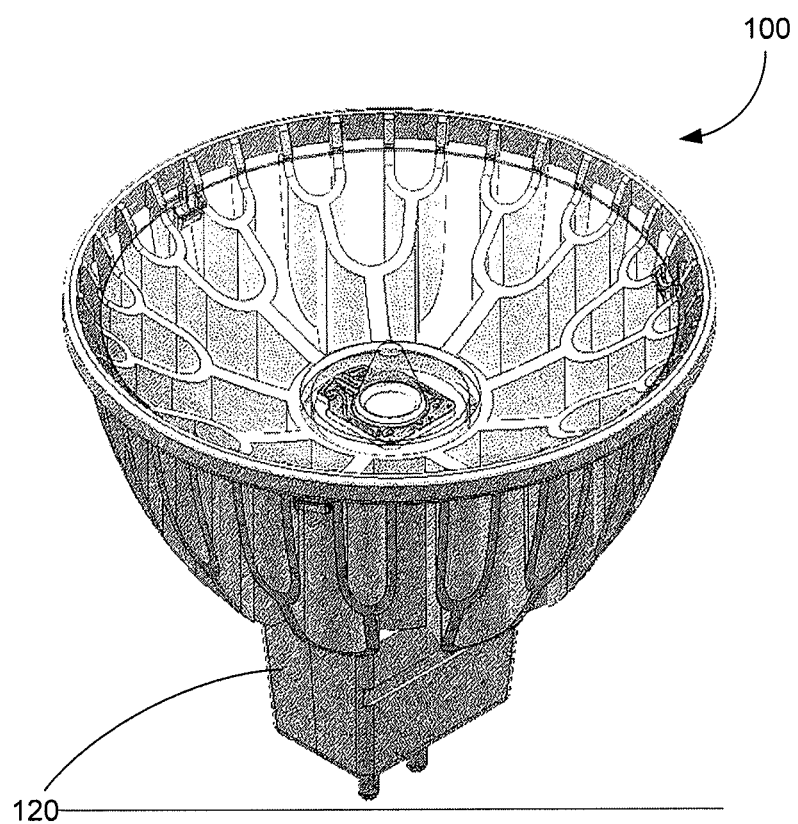
FIGS. 1A-B illustrate various embodiments of the present invention.
Figure 1B:
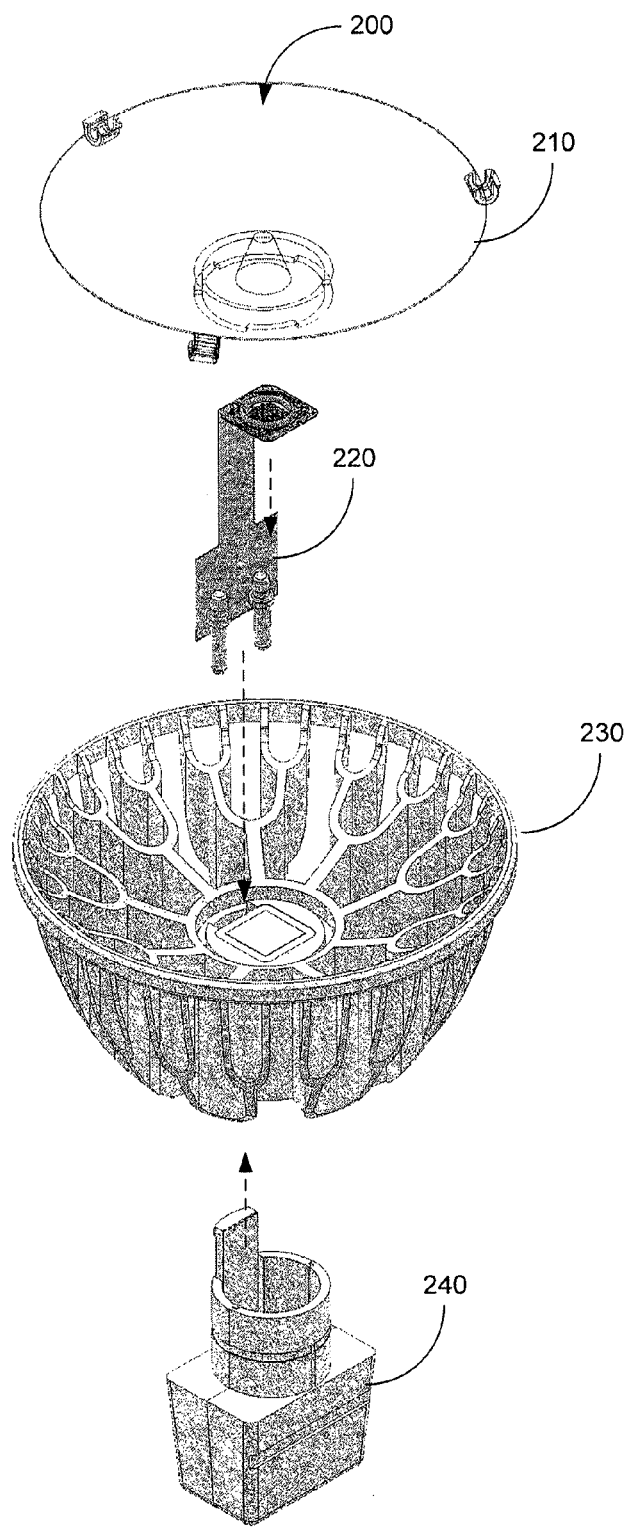

FIG. 1A illustrates an embodiment of the present invention. More specifically, FIG. 1A-B illustrate embodiments of MR-16 form factor compatible LED lighting source 100 having GU 5.3 form factor compatible base 120. MR-16 lighting sources typically operate upon 12 volts, alternating current (e.g. VAC). In the examples illustrated, LED lighting source 100 is configured to provide a spot light having a 10 degree beam size. In other embodiments LED lighting sources may be configured to provide a flood light having a 25 or 40 degree beam size, or any other lighting pattern.

In various embodiments, an LED assembly described in the pending patent applications described above, and variations thereof, may be used within LED lighting source 100. Theses LED assemblies are currently under development by the assignee of the present patent application. In various embodiments, LED lighting source 100 may provide a peak output brightness of approximately 7600 to 8600 candelas (with approximately 360 to 400 lumens), a peak output brightness of approximately 1050 to 1400 candelas for a 40 degree flood light (with approximately 510 to 650 lumens), and a peak output of approximately 2300 to 2500 candelas for a 25 degree flood light (with approximately 620 to 670 lumens), and the like. Various embodiments of the present invention therefore are believed to have achieve the same brightness as conventional halogen bulb MR-16 lights.

FIG. 1B illustrates a modular diagram according to various embodiments of the present invention. As can be seen in FIG. 1B in various embodiments, light 200 includes a lens 210, an integrated LED module/assembly 220, a heat-sink 230, and a base housing 240. As will be discussed further below, in various embodiments, the modular approach to assembling light 200 are believed to reduce the manufacturing complexity, reduce manufacturing costs, and increase the reliability of such lights.

In various embodiments, lens 210 may be formed from a UV and resistant transparent material, such as glass, polycarbonate material, or the like. In various embodiments, lens 210 may be solid. In the case of lens 210, the solid material creates a folded light path such that light that is generated by the integrated LED assembly 220 internally reflects within lens 210 more than one time prior to being output. Such a folded optic lens enables light 200 to have a tighter columniation of light than is normally available from a conventional reflector of equivalent depth.

In various embodiments, to increase durability of the lights, the transparent material should be operable at an elevated temperature (e.g. 120 degrees C.) for a prolonged period of time (e.g. hours). One material that may be used for lens 210 is known as Makrolon™ LED 2045 or LED 2245 polycarbonate available from Bayer Material Science AG. In other embodiments, other similar materials may also be used.

In FIG. 1B, lens 210 may be secured to heat-sink 230 via one or more clips integrally formed on the edge of lens 210. In addition, lens 210 may also be secured via an adhesive proximate to where integrated LED assembly 220 is secured to heat-sink 230. In various embodiments, separate clips may be used to restrain lens 210. These clips may be formed of heat resistant plastic material that is preferably white colored to reflect backward scattered light back through the lens.

In various embodiments of the present invention, LED assemblies may be binned based upon lumen per watt efficacy. For example, in some examples, an integrated LED module/assembly having a lumen per watt (L/W) efficacy from 53 to 66 L/W may be binned for use for 40 degree flood lights, a LED assembly having an efficacy of approximately 60 L/W may be binned for use for spot lights, a LED assembly having an efficacy of approximately 63 to 67 L/W may be use for 25 degree flood lights, and the like. In other embodiments, other classification or categorization of LED assemblies on the basis of L/W efficacy may used for other target applications.

In some embodiments, as will be discussed below integrated LED assembly/module 220 typically includes 36 LEDs arranged in series, in parallel series (e.g. three parallel strings of 12 LEDs in series), or the like. In other embodiments, any number of LEDs may be used, e.g. 1, 10, 16, or the like. In other embodiments, the LEDs may be electrically coupled in other manner, e.g. all series, or the like. Further detail regarding such LED assemblies are provided in the patent applications incorporated by reference above.

In various embodiments, the targeted power consumption for LED assemblies is less than 13 watts. This is much less than the typical power consumption of halogen based MR-16 lights (50 watts). Accordingly, embodiments of the present invention are able to match the brightness or intensity of halogen based MR-16 lights, but using less than 20% of the energy.

In various embodiments of the present invention, LED assembly 220 is directly secured to heat-sink 230. As will be discussed below, LED assembly 220 typically includes a flat substrate such as silicon or the like. In various embodiments, it is contemplated that an operating temperature of LED assembly 220 may be on the order of 125 to 140 degrees C. The silicon substrate is then secured to the heat-sink using a high thermal conductivity epoxy (e.g. thermal conductivity~96 W/m.k.). In some embodiments, a thermoplastic/thermo set epoxy may be used such as TS-369, TS-3332-LD, or the like, available from Tanaka Kikinzoku Kogyo K.K. Other epoxies may also be used. In some embodiments, no screws are otherwise used to secure the LED assembly to the heat-sink, however, screws or other fastening means may also be used in other embodiments.

In various embodiments, heat-sink 230 may be formed from a material having a low thermal resistance/high thermal conductivity. In some embodiments, heat-sink 230 may be formed from an anodized 6061-T6 aluminum alloy having a thermal conductivity k=167 W/m.k., and a thermal emissivity e=0.7. In other embodiments, other materials may be used such as 6063-T6 or 1050 aluminum alloy having a thermal conductivity k=225 W/mk and a thermal emissivity e=0.9. In other embodiments, still other alloys such AL 1100, or the like may be used. Additional coatings may also be added to increase thermal emissivity, for example, paint provided by ZYP Coatings, Inc. utilizing CR2O3 or CeO2 may provide a thermal emissivity e=0.9; coatings provided by Materials Technologies Corporation under the brand name Duracon™ may provide a thermal emissivity e>0.98; and the like. In other embodiments, heat-sink 230 may include other metals such as copper, or the like.

In some example, at an ambient temperature of 50 degrees C., and in free natural convection heat-sink 230 has been measured to have a thermal resistance of approximately 8.5 degrees C./Watt, and heat-sink 290 has been measured to have a thermal resistance of approximately 7.5 degrees C./Watt. With further development and testing, it is believed that a thermal resistance of as little as 6.6 degrees C./Watt are achievable in other embodiments. In light of the present patent disclosure, it is believed that one of ordinary skill in the art will be able to envision other materials having different properties within embodiments of the present invention.

In various embodiments, base assemblies/modules 240 in FIG. 1B provides a standard GU 5.3 physical and electronic interface to a light socket. As will be described in greater detail below, a cavity within base module 240 includes high temperature resistant electronic circuitry used to drive LED module 220. In various embodiments, an input voltage of 12 VAC to the lamps are converted to 120 VAC, 40 VAC, or other voltage by the LED driving circuitry. The driving voltage may be set depending upon specific LED configuration (e.g. series, parallel/series, etc.) desired.

The shell of base assembly 240 may be formed from an aluminum alloy, and may formed from an alloy similar to that used for heat-sink 230 and/or heat-sink 290. In one example, an alloy such as AL 1100 may be used. In other embodiments, high temperature plastic material may be used. In some embodiments of the present invention, instead of being separate units, base assembly 240 may be monolithically formed with heat-sink 230.

As illustrated in FIG. 1B, a portion of the LED assembly 220 (silicon substrate of the LED device) contacts heat-sink 230 in a recess within the heat-sink 230. Additionally, another portion of the LED assembly 220 (containing the LED driving circuitry) is bent downwards and is inserted into an internal cavity of base module 240.

In various embodiments, to facilitate a transfer of heat from the LED driving circuitry to the shell of the base assemblies, and of heat from the silicon substrate of the LED device, a potting compound is provided. The potting compound may be applied in a single step to the internal cavity of base assembly 240 and to the recess within heat-sink 230. In various embodiments, a compliant potting compound such as Omegabond® 200 available from Omega Engineering, Inc. or 50-1225 from Epoxies, Etc. may be used. In other embodiments, other types of heat transfer materials may be used.

Figure 2A:
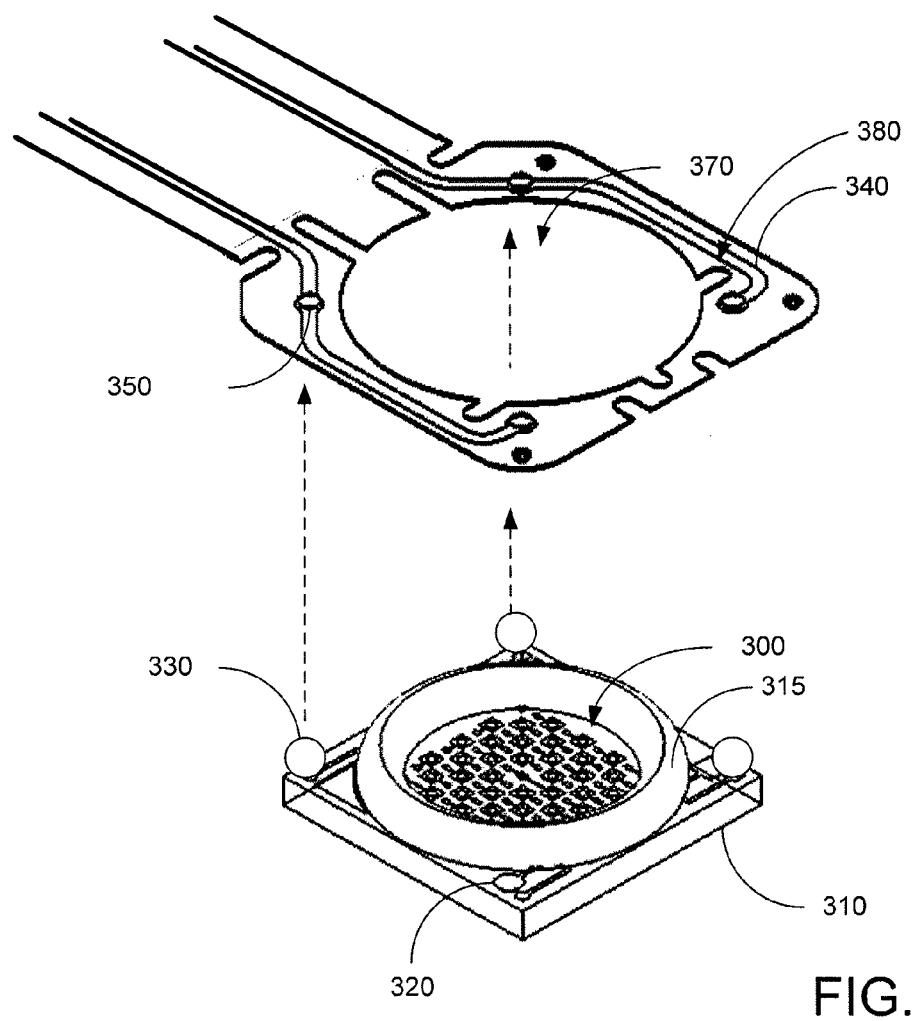
FIGS. 2A-B illustrate an embodiment of the present invention.
Figure 2B:
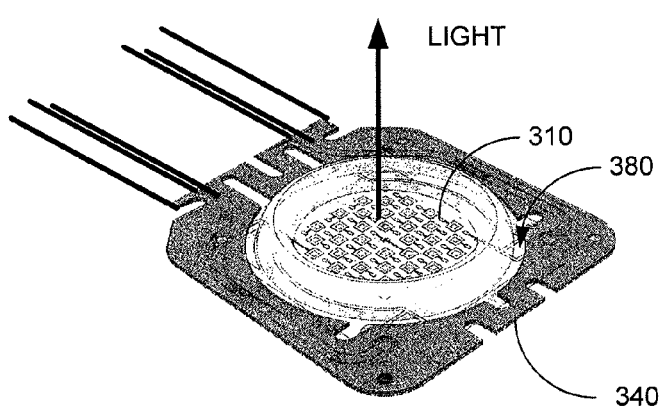

FIGS. 2A-B illustrate an embodiment of the present invention. More specifically, FIG. 2A illustrates an LED package subassembly (LED module) according to various embodiments. More specifically, a plurality of LEDs 300 are illustrated disposed upon a silicon substrate 310. In some embodiments, it is contemplated that the plurality of LEDs 300 are connected in series and powered by a voltage source of approximately 120 volts AC (VAC). To enable a sufficient voltage drop (e.g. 3 to 4 volts) across each LED 300, in various embodiments 30 to 40 LEDs are contemplated to be used. In specific embodiments, 37 to 39 LEDs are coupled in series. In other embodiments, LEDs 300 are connected in parallel series and powered by a voltage source of approximately 40 VAC. For example, the plurality of LEDs 300 include 36 LEDs arranged in three groups each having 12 LEDs 300 coupled in series. Each group is thus coupled in parallel to the voltage source (40 VAC) provided by the LED driver circuitry, such that a sufficient voltage drop (e.g. 3 to 4 volts) is achieved across each LED 300. In other embodiments, other driving voltages are envisioned, and other arrangements of LEDs 300 are also envisioned.

In various embodiments, the LEDs 300 are mounted upon a silicon substrate 310, or other thermally conductive substrate. In various embodiments, a thin electrically insulating layer and/or a reflective layer may separate LEDs 300 and the silicon substrate 310. Heat produced from LEDs 300 is typically transferred to silicon substrate 310 and to a heat-sink via a thermally conductive epoxy, as discussed above.

In various embodiments, silicon substrate is approximately 5.7 mm×5.7 mm in size, and approximately 0.6 microns in depth. The dimensions may vary according to specific lighting requirement. For example, for lower brightness intensity, fewer LEDs may be mounted upon the substrate, accordingly the substrate may decrease in size. In other embodiments, other substrate materials may be used and other shapes and sizes may also be used As shown in FIG. 2A, a ring of silicone 315 is disposed around LEDs 300 to define a well-type structure. In various embodiments, a phosphorus bearing material is disposed within the well structure. In operation, LEDs 300 provide a blue-ish light output, a violet, or a UV light output. In turn, the phosphorous bearing material is excited by the blue/uv output light, and emits white light output. Further details of embodiments of plurality of LEDs 300 and substrate 310 are described in the co-pending application incorporated by reference and referred to above.

As illustrated in FIG. 2A, a number of bond pads 320 may be provided upon the top surface of substrate 310 (e.g. 2 to 4 bond pads). Then, a conventional solder layer (e.g. 96.5% tin and 5.5% gold) may be disposed upon silicon substrate 310, such that one or more solder balls 330 are formed thereon. In the embodiments illustrated in FIG. 2A, four bond pads 320 are provided, one at each corner, two for each power supply connection. In other embodiments, only two bond pads may be used, one for each AC power supply connection.

Illustrated in FIG. 2A is a flexible printed circuit (FPC) 340. In various embodiments, FPC 340 may include a flexible substrate material such as a polyimide, such as Kapton™ from DuPont, or the like. As illustrated, FPC 340 may have a series of bonding pads 350, for bonding to silicon substrate 310, and bonding pads 360, for coupling to the high supply voltage (e.g. 120 VAC, 40 VAC, etc). Additionally, in some embodiments, an opening 370 is provided, through which LEDs 300 will shine through. In some embodiments, opening 370 may be a closed shape, e.g. circle, square, etc, however in other embodiments, opening 370 may be an open shape, e.g. similar to a tuning fork.

Various shapes and sizes for FPC 340 are contemplated in various embodiments of the present invention. For example, as illustrated in FIG. 2A, a series of cuts 380 may be made upon FPC 340 to reduce the effects of expansion and contraction of FPC 340 versus substrate 310. As another example, a different number of bonding pads 350 may be provided, such as two bonding pads. As merely another example, FPC 340 may be crescent shaped, and opening 370 may not be a through hole. In other embodiments, other shapes and sizes for FPC 340 are contemplated in light of the present patent disclosure.

In various embodiments, the silicon substrate 310 is bonded to a first portion of FPC 340. As shown in FIGS. 2A and B, FPC 340 extends to a second portion, where the electronic driving components are bonded there to. In some embodiments, the side of the FPC 340 where the silicon substrate 310 is bonded to is the same side as where the electronic driving components are also bonded to.

In FIG. 2B, substrate 310 is bonded to FPC 340 via solder balls 330, in a conventional flip-chip type arrangement to the top surface of the silicon. By making the electrical connection at the top surface of the silicon, it is electrically isolated from the heat transfer surface of the silicon. This allows the entire bottom surface of the silicon substrate 310 to transfer heat to the heat-sink. Additionally, this allows the LED to bonded directly to the heat-sink to maximize heat transfer instead of a PCB material that typically inhibits heat transfer. As can be seen in this configuration, LEDs 300 are thus positioned to emit light through opening 370. In various embodiments, the potting compound discussed above is also used to serve as an under fill operation, or the like to seal the space 380 between substrate 310 and FPC 340.

After the electronic driving devices and the silicon substrate 310 are bonded to FPC 340, the LED package sub assembly or module 220 is thus assembled. In various embodiments, these LED modules may then be individually tested for proper operation.

Figure 3:
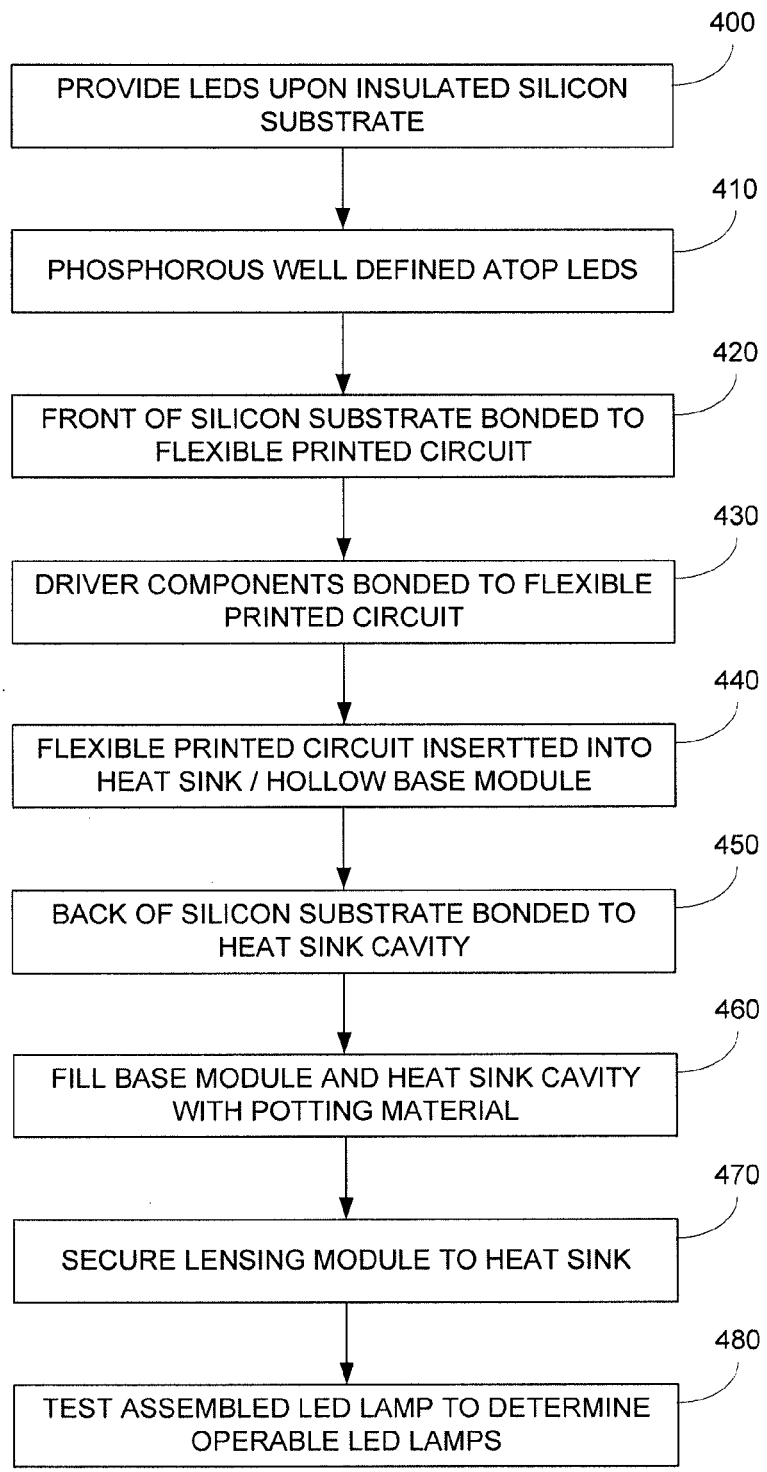
FIG. 3 illustrate a block diagram of a manufacturing process according to embodiments of the present invention.

FIG. 3 illustrates a block diagram of a manufacturing process according to embodiments of the present invention. In various embodiments, some of the manufacturing separate processes may occur in parallel or in series. For sake of understanding, reference may be given to features in prior figures.

In various embodiments, the following process may be performed to form an LED assembly/module. Initially, a plurality of LEDs 300 are provided upon an electrically insulated silicon substrate 310 and wired, step 400. As illustrated in FIG. 2A, a silicone dam 315 is placed upon the silicon substrate 310 to define a well, which is then filled with a phosphor-bearing material, step 410. Next, the silicon substrate 310 is bonded to a flexible printed circuit 340, step 420. As disclosed above, a solder ball and flip-chip soldering (e.g. 330) may be used for the soldering process in various embodiments.

Next, a plurality of electronic driving circuit devices and contacts may be soldered to the flexible printed circuit 340, step 430. The contacts are for receiving a driving voltage of approximately 12 VAC. As discussed above, unlike present state of the art MR-16 light bulbs, the electronic circuit devices, in various embodiments, are capable of sustained high-temperature operation, e.g. 120 degrees C.

In various embodiments, the second portion of the flexible printed circuit including the electronic driving circuit is inserted into the heat-sink and into the inner cavity of the base module, step 440. As illustrated, the first portion of the flexible printed circuit is then bent approximately 90 degrees such that the silicon substrate is adjacent to the recess of the heat-sink. The back side of the silicon substrate is then bonded to the heat-sink within the recess of the heat-sink using an epoxy, or the like, step 450. Subsequently a potting material is used to fill the air space within the base module and to serve as an under fill compound for the silicon substrate, step 460.

Subsequently, a lens may be secured to the heat-sink, step 470, and the LED light source may then be tested for proper operation, step 480.

Figure 4:
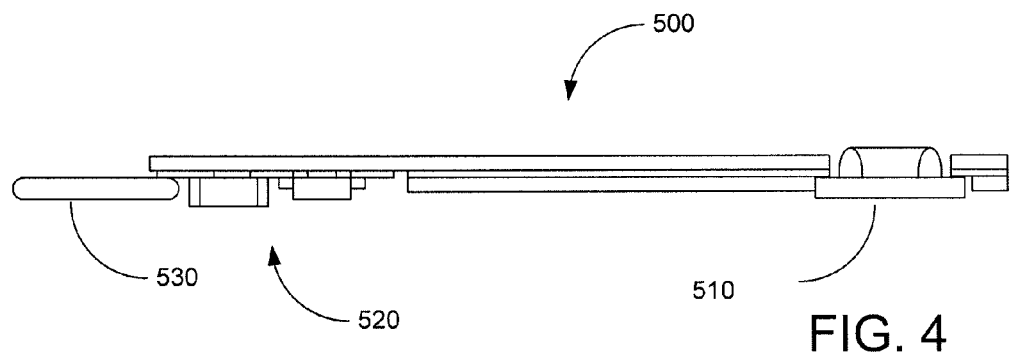
FIG. 4 illustrate an example of an integrated lighting module according to embodiments of the present invention.

FIG. 4 illustrates an embodiment of the present invention. More specifically, FIG. 4 illustrates a side view of a flexible printed circuit 500. In various embodiments, a top surface of silicon substrate 510 including the light emitting elements is shown bonded to a bottom surface of FPC 500 within a first region. Additionally, electronic driving circuits 520 and electrical connections 530 is also shown bonded to the bottom surface of FPC 500 with a second region. In various embodiments, FPC is typically insulated between the first region and the second region.

Figure 5A:
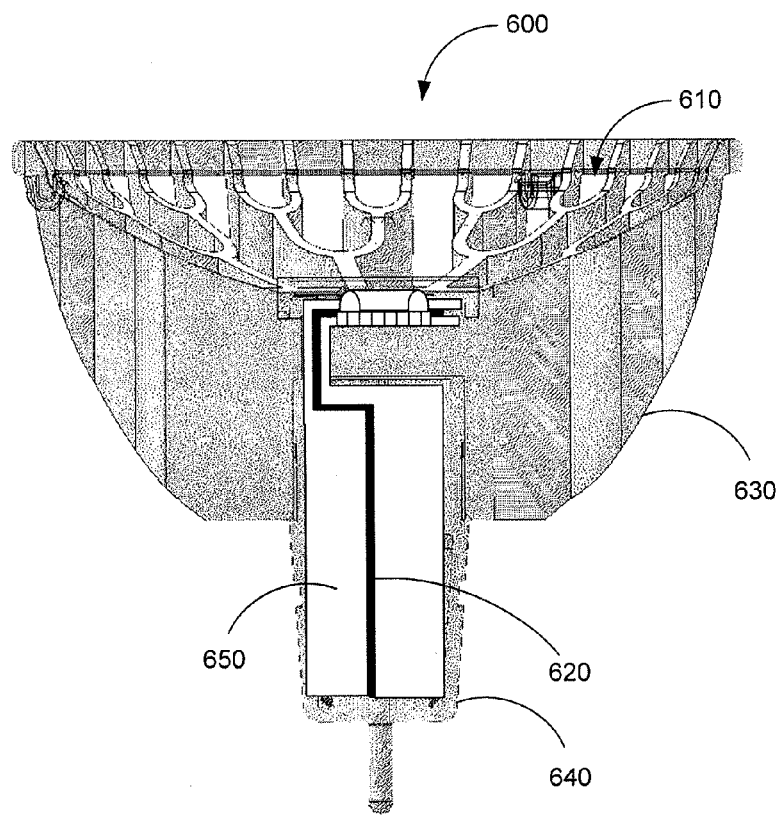
FIGS. 5A-B illustrate examples during the manufacturing process according to embodiments of the present invention.
Figure 5B:
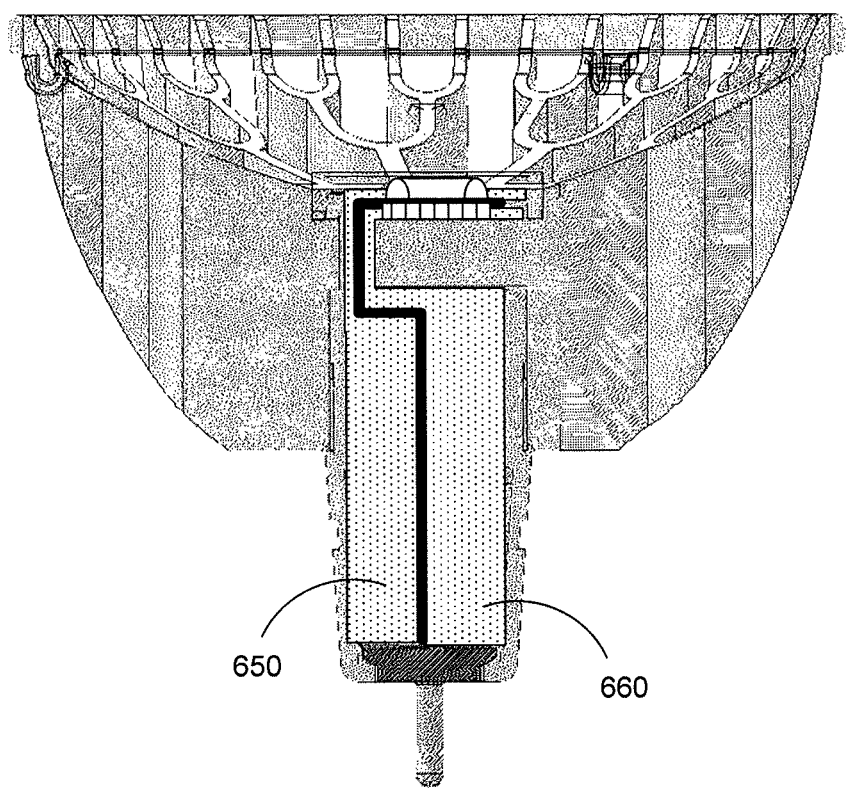

FIGS. 5A-B illustrate various embodiments of the present invention. More specifically, FIGS. 5A-B illustrate cross-section views of planned embodiments of the present invention.

In FIG. 5A, a cross-section of an embodiment of a MR-16 form factor compatible LED lighting source 600 having a GU 5.3 form factor compatible base, although other form factors are contemplated. In various embodiments, lighting source 600 includes a lens 610, an integrated LED assembly/module 620, a heat-sink 630, and a base assembly 640. As illustrated, integrated LED assembly/module 620 may include one or more bends. A white-spaced region 650 is also illustrated, illustrating contemplated air-gap regions between the FPC and heat-sink 630 and base assembly 640.

In various embodiments, lighting source 600 represents a configuration of an LED light source having a combination of performance characteristics that have not been previously achievable with LED light sources. More specifically, in a spot light configuration, as shown in FIG. 5A, the light source is characterized with a highly concentrated spot beam: FWHM beam angle of approximately 9.8°, having a field angle of approximately 13.3°, and a full cutoff angle of approximately 31.4°. Additionally, the light source is characterized by high maximum intensity: center beam candle-power (CBCP) 24.60 cd/LPKG with 81.9% lumens efficiency.

In the cross-section in FIG. 5B, the air-gap region 650 is shown filled with potting material 660. As discussed above, the potting material 660 is used to fill the cavity within base assembly 640 about the second portion of the integrated LED assembly 620, and to fill the recess within heat-sink 630 where the LED silicon substrate contacts heat-sink 630. In various embodiments, all of the potting material 660 is applied in a single step.

Further embodiments can be envisioned to one of ordinary skill in the art after reading this disclosure. In other embodiments, combinations or sub-combinations of the above disclosed invention can be advantageously made. The block diagrams of the architecture and flow charts are grouped for ease of understanding. However it should be understood that combinations of blocks, additions of new blocks, re-arrangement of blocks, and the like are contemplated in alternative embodiments of the present invention.

The specification and drawings are, accordingly, to be regarded in an illustrative rather than a restrictive sense. It will, however, be evident that various modifications and changes may be made thereunto without departing from the broader spirit and scope.

What is claimed is:

1. A light source comprising:
   a heat-sink comprising;
      an inner core region;
      a mounting region disposed within the inner core region; and
      a plurality of heat-dissipating fins extending from the inner core region;
      wherein the plurality of heat-dissipating fins and the mounting region define an inner cavity and a through slot adjacent the mounting region;
   a base housing disposed within the inner cavity; and
   an integrated lighting module comprising:
      a flexible printed circuit;
      a light emitting source formed on a top surface of a substrate, wherein the top surface of the substrate is mechanically and electrically coupled to a first region of the flexible printed circuit;
      an electronic driving circuit configured to provide electrical power to the light emitting source, wherein the electronic driving circuit is mechanically and electrically coupled to a second region of the flexible printed circuit; and
      an electrical connector mechanically and electrically coupled to an end of the flexible printed circuit;
   wherein:
      a bottom surface of the substrate is mechanically and thermally coupled to the mounting region of the heat-sink,
      the second region of the flexible printed circuit is disposed within the base housing, and
      a portion of the flexible printed circuit between the first region and the second region is disposed within the through slot.

2. The light source of claim 1
   wherein the bottom surface of the substrate is mechanically and thermally coupled to the mounting region of the heat-sink via a thermally conductive epoxy; and
   wherein the heat-sink comprises aluminum or copper.

3. The light source of claim 1 further comprising a potting compound, wherein the potting compound is disposed within the mounting region in contact with the first region of the flexible printed circuit, and is disposed within the base housing in contact with the second region of the flexible printed circuit, the potting compound being configured to conduct heat generated from the integrated lighting module to the heat-sink and to the base housing.

4. The light source of claim 1
wherein the electronic driving circuit is configured to receive an AC voltage and is configured to provide the electrical power to the light emitting source in response to the AC voltage; and
wherein the electronic driving circuit comprises at least one resistor, at least one capacitor, at least one integrated circuit, and at least one switching component.

5. The light source of claim 4
wherein the electrical connector comprises a plurality of power pins and the plurality of power pins are configured to receive the AC voltage from an external supply.

6. The light source of claim 1 wherein the flexible printed circuit comprises polyimide.

7. The light source of claim 6 wherein the first region of the flexible printed circuit is oriented at approximately 90 degrees relative to at least a portion of the second region of the flexible printed circuit.

8. The light source of claim 1 wherein the base housing comprises a GU 5.3 form factor compatible base.

9. The light source of claim 1
wherein the light emitting source comprises a plurality of light emitting diodes; and
wherein the heat-sink comprises an MR-16 compatible form factor.

10. The light source of claim 9 further comprising a lens coupled to the heat-sink, wherein the lens is configured to focus light output from the plurality of light emitting diodes.

11. The light source of claim 1, wherein the through slot is sized to accommodate the electronic driving circuit.

12. A method for assembling a light source, the method comprising:
receiving a heat-sink comprising an inner core region, a mounting region disposed within the inner core region, and a plurality of heat-dissipating structures extending from the inner core region, wherein the plurality of heat-dissipating structures and the mounting region define an inner cavity and a through slot adjacent the mounting region;
receiving a base housing disposed within the inner cavity;
receiving an integrated lighting module, wherein the integrated lighting module comprises a flexible printed circuit having a first region and a second region, the first region being mechanically and electrically coupled to a top surface of a light emitting source substrate, and within the second region being mechanically and electrically coupled to a plurality of electronic driving devices, and wherein the light emitting source substrate comprises a light emitting source;
disposing the second region of the flexible printed circuit within the base housing;
disposing a portion of the flexible printed circuit between the first region and the second region within the through slot; and
mechanically and thermally coupling a bottom surface of the light emitting source substrate to the mounting region of the heat-sink.

13. The method of claim 12 wherein the bottom surface of the light emitting source substrate is mechanically and thermally coupled to the mounting region of the heat-sink using a thermally conductive epoxy.

14. The method of claim 12 further comprising
disposing a thermally conductive potting compound within the mounting region to be in contact with the first region of the flexible printed circuit, and within the base housing to be in contact with the second region of the flexible printed circuit.

15. The method of claim 12
wherein the electronic driving devices are configured to receive an AC voltage and are configured to provide electrical power to the light emitting source in response to the AC voltage; and
wherein the electronic driving devices are selected from a group consisting of: a resistor, a capacitor, an integrated circuit, and a switching component.

16. The method of claim 12 wherein the flexible printed circuit comprises polyimide.

17. The method of claim 12 wherein, after disposing the second region of the flexible printed circuit within the base housing, the method further comprises bending the first region of the flexible printed circuit relative to at least a portion of the second region of the flexible printed circuit to an angle of approximately 90 degrees.

18. The method of claim 12 wherein receiving the integrated lighting module further comprises:
receiving the flexible printed circuit;
receiving the light emitting source substrate;
receiving the plurality of electronic driving devices;
mechanically and electrically coupling the top surface of the light emitting source substrate to the flexible printed circuit within the first region; and
mechanically and electrically coupling the plurality of electronic driving devices to the flexible printed circuit within the second region.

19. The method of claim 18 further comprising mechanically and electrically coupling an electrical connector to an end of the flexible printed circuit, wherein the electrical connector comprises a plurality of power pins configured to receive an AC voltage.

20. The method of claim 12
wherein the light emitting source comprises a plurality of light emitting diodes,
wherein the heat-sink comprises an MR-16 compatible form factor, and
wherein the base housing comprises a GU 5.3 form factor compatible base.

21. The method of claim 12 further comprising:
receiving a lens, wherein the lens is configured to redirect light output from the light emitting source; and
coupling the lens to the heat-sink.

22. The method of claim 12, wherein disposing the second region of the flexible printed circuit within the base housing comprises passing the second region of the flexible printed circuit through the through slot.

* * * * *